United States Patent [19]

Takahashi et al.

[11] Patent Number: 4,874,954
[45] Date of Patent: Oct. 17, 1989

[54] PROJECTION EXPOSURE APPARATUS

[75] Inventors: Kazuo Takahashi; Hiroyoshi Kubo, both of Kawasaki, Japan

[73] Assignee: Canon Kabushiki Kaisha, Tokyo, Japan

[21] Appl. No.: 319,877

[22] Filed: Mar. 1, 1989

Related U.S. Application Data

[63] Continuation of Ser. No. 151,308, Feb. 1, 1988, abandoned.

[30] Foreign Application Priority Data

Feb. 2, 1987 [JP] Japan .................................. 62-023159
Apr. 21, 1987 [JP] Japan .................................. 62-096320

[51] Int. Cl.$^4$ ........................................... G01N 21/80
[52] U.S. Cl. ........................................ 250/548; 355/45
[58] Field of Search .................. 250/548, 557; 355/43, 355/45; 356/400, 401

[56] References Cited

U.S. PATENT DOCUMENTS 4,573,791 3/1986 Phillips .................................. 355/43
4,585,337 4/1986 Phillips .................................. 355/45
4,597,664 7/1986 Johannsmeier et al. ............... 355/43

*Primary Examiner*—David C. Nelms
*Assistant Examiner*—Eric F. Chatman
*Attorney, Agent, or Firm*—Fitzpatrick, Cella, Harper & Scinto

[57] ABSTRACT

An exposure apparatus includes an imaging optical system to project, in sequence, images of a pattern of an original upon different regions of a workpiece, the imaging optical system having an optical axis, a detecting system to irradiate a predetermined portion of a first region of the workpiece to detect the position of the first portion with respect to a direction of the optical axis of the imaging optical system, a workpiece carrying stage for carrying thereon the workpiece and being movable in a plane perpendicular to the optical axis, the workpiece carrying stage being movable to allow detection of the position of the first region with respect to the direction of the optical axis by the detecting system and the projection of the image of the pattern upon the first region by the imaging optical system, an aligning system to bring the position of the first region with respect to the direction of the optical axis into coincidence with the image of the pattern projected by the imaging optical system, and a correcting system to move the workpiece carrying stage to a position which is different from a position at which the image of the pattern of the original can be projected upon the second region.

21 Claims, 5 Drawing Sheets

PROJECTION EXPOSURE APPARATUS

This application is a continuation of application Ser. No. 151,308 filed Feb. 1, 1988, now abandoned.

FIELD OF THE INVENTION AND RELATED ART

This invention relates to a projection exposure apparatus and, more particularly, to a step-and-repeat type projection exposure apparatus having a reduction projection optical system by which an image of a circuit pattern of a reticle, prepared for the manufacture of semiconductor microcircuits, is projected upon a semiconductor wafer disposed in an image plane of the projection optical system.

The minimum linewidth of a pattern constituting a semiconductor microcircuit device is decreasing with the increase in the capacity of the circuit device. To allow manufacture of such microcircuits, projection exposure apparatuses must have high resolution. In order to satisfy such requirement, in an aspect, an original such as a reticle having a circuit pattern and a wafer which is a workpiece onto which the pattern of the reticle should be transferred by means of a projection optical system, should be exactly positioned, respectively, in preset optical reference planes which are optically conjugate with each other with respect to the projection optical system.

Use of air sensors to detect the position of a wafer with respect to the direction of the optical axis of a projection optical system has been proposed in U.S. Pat. No. 4,600,282 and U.S. patent application Ser. No. 843,392 both of which have been assigned to the same assignee of the subject application. Further, use of a position sensor means for detecting a light reflected from a wafer, having been illuminated along an inclined direction, to thereby detect the positional deviation of the surface of the wafer from the focal position (an ideal imaging plane) of a projection optical system has been proposed in U.S. Pat. No. 4,395,117 and U.S. patent application Ser. No. 931,997 both of which have been assigned to the same assignee of the subject application. Similar proposals have been made in U.S. Pat. Nos. 4,570,059, 4,558,949 and 4,589,773.

In a case where a reticle has formed thereon circuit patterns corresponding to plural chips (semiconductor chips), there is a possibility that the position detecting light inclinedly projected toward the peripheral portion of a wafer is not incident upon the wafer surface. If this occurs, no reflection light is detectable from the wafer and, for this reason, the wafer surface can not be exactly positioned at the focal position of the projection lens system. Further, there is a possibility of occurrence of a detection error due to the state of the wafer surface by which the position detecting light is reflected.

SUMMARY OF THE INVENTION

It is an object of the present invention to provide a step-and-repeat type projection exposure apparatus wherein, for any portion of a wafer, the deviation of the wafer surface position from a focal position is detectable accurately, to thereby allow correct step-and-repeat exposures of the wafer.

Briefly, the present invention allows automatic focusing for a peripheral portion of a workpiece (such as a semiconductor wafer) as well as a central portion of the workpiece. For the focusing for the peripheral portion of the workpiece, stepwise movement of a workpiece carrying stage which is predetermined constant is corrected, if necessary, so as to assure that the light used for the focusing is surely projected upon the workpiece surface within the detectable range. This enables that, for such peripheral portion of the workpiece, the workpiece is accurately positioned in an optical reference plane (an imaging plane of a projection optical system) which is exactly in an optically conjugate relation with an original such as a reticle having a pattern to be transferred onto the workpiece.

In accordance with one aspect of the present invention and where a reticle has formed thereon a plurality of chip patterns, corresponding to plural semiconductor chips, so that the plural chip patterns are printed on a wafer by one exposure (shot), the amount of corrected movement is determined so that it becomes equal to a value obtained by multiplying, by an integral number, the size of one chip pattern (to be exact, the size of a region in which one chip pattern is printed) and, additionally, so that the achievement of the corrected movement is effective to minimize the moving distance required for subsequently displacing the wafer to the exposure station.

In another aspect, the regular stepwise movement is corrected so that the position detection is carried out with respect to such region of the wafer which region has substantially the same surface shape as that of a regular region for the regular position detection made without the correction of the stepwise movement and which is at a minimum distance from the current detecting position. This is effective to avoid any detection error resulting from any difference in the reflection factor of the wafer.

For the corrected movement of the workpiece carrying stage, the position of the stage may be controlled by use of a high-precision laser interferometer since, in such case, high-precision movement of the stage is ensured.

If there is no region on the workpiece having the same or substantially the same surface shape as that of the regular region with respect to which the regular position detection is effected (without correction of movement), the position detection may be carried out with respect to a given location on the workpiece with correction for the result of detection. Namely, the position of the surface of the workpiece may be detected with respect to said location and the workpiece may be displaced in the Z-axis direction in accordance with the result of detection having been corrected.

In actual focusing operation, a workpiece carrying stage is moved with correction, if necessary, and after the corrected movement the position of the workpiece surface in the Z-axis direction is detected. In accordance with the detection, the position of the workpiece in the Z-axis direction is adjusted. This adjustment may be carried out simultaneously with the movement of the workpiece toward the exposure station These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
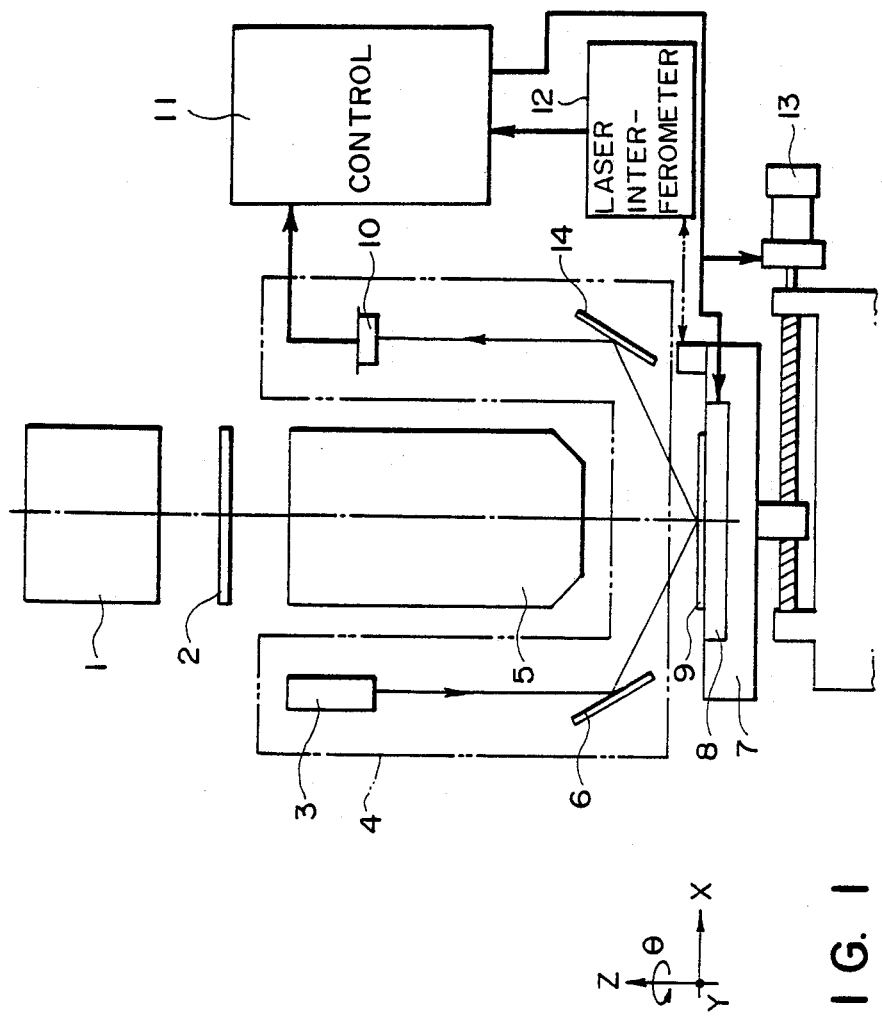
FIG. 1 is a schematic and diagrammatic view of a projection exposure apparatus according to one embodiment of the present invention.

Referring first to FIG. 1, there is shown a step-and-repeat type projection exposure apparatus which is adapted to project and print, upon a semiconductor wafer, images of a circuit pattern or patterns (chip patterns) formed on a reticle for the manufacture of semiconductor microcircuits.

Denoted at 1 in FIG. 1 is an illumination system for providing a light which is efficiently projected upon a reticle 2. In this embodiment, the reticle 2 has formed thereon a plurality of chip patterns. When the chip patterns of the reticle 2 are illuminated by the light from the illumination system 1, these patterns are projected and imaged upon a wafer 9 in a reduced scale by means of a projection lens system 5. The wafer 9 is preparatorily positioned, before the exposure, so that the surface thereof is exactly placed in an imaging plane of the projection lens system 5. Thus, the chip patterns of the reticle 2 are correctly printed on a particular shot area on the wafer 9 which area is placed at that time at the exposure station.

Provided below the wafer 9 is a Z stage 8 which is arranged to displace the wafer 9 along a Z axis corresponding to the optical axis of the projection lens system 5. Denoted generally at 4 is a position detecting device which is arranged to measure or detect such numerical value that is necessary for accurately placing the wafer 9 surface at the focal position (the position in the imaging plane) of the projection lens system 5. The position of the Z stage 8 in the Z-axis direction is controlled in accordance with the detection by the position detecting device 4, so that the wafer 9 surface is correctly placed at the focal position. The position detecting device 4 used in the present embodiment is of a well-known type such as disclosed in the aforementioned U.S. Pat. Nos. 4,570,059, 4,558,949 and 4,589,773, wherein the position of the wafer 9 is detected optically. The position detecting device 4 includes a light source 3, mirrors 6 and 14 and a photosensor (photoreceptor) 10. The light from the light source 3 is reflected by the mirror 6 so that it is inclinedly incident upon the surface of the wafer 9 (more particularly, at a position of intersection of the wafer 9 surface with the optical axis of the projection lens system 5). The light reflected by the wafer 9 is directed to the sensor 10 by means of the mirror 14, and the sensor 10 produces a positional signal corresponding to the position of the wafer 9 surface with respect to the Z-axis direction.

The Z stage 8 is supported by an X-Y stage 7 which is movable to allow step-and-repeat exposures of the wafer 9. The X-Y stage 7 is driven along X and Y axes by means of a driving motor 13 so as to place, one by one, the shot areas of the wafer 9 (each area being a region which is going to be exposed by "one exposure") at the exposure station defined by the projection lens system 5. The position of the X-Y stage 7 with respect to the X and Y directions is precisely controlled by use of a laser interferometer 12.

Controller 11 receives the Z-axis positional signal related to the wafer 9 and produced by the position detecting device 4, and functions to detect any positional deviation of the wafer 9 surface with respect to the focal position of the projection lens system 5. The controller 11 is operable to apply an instruction signal to the Z stage 8 so as to correct the detected positional deviation. Also, for ensuring accurate positioning of the X-Y stage 7, the controller 11 receives as a feedback signal an output of the laser interferometer 12, measuring the current position of the stage 7, and functions to supply a driving signal for the X-Y stage 7 to thereby control the position thereof precisely. Additionally, the controller 11 is operable to discriminate, for each shot area of the wafer, whether the normal position detecting operation is attainable or not. The discrimination is made on the basis of specific information such as, for example, a data concerning the shot layout on the wafer which information has been preparatorily stored in a suitable memory included in the controller 11. In accordance with the discrimination, the controller 11 calculates, if necessary, the amount of corrected stepwise movement for the X-Y stage 7 and instructs such corrected movement to the stage 7. Details of such corrected movement will be described, taken in conjunction with FIGS. 2 and 3.

Figure 2:
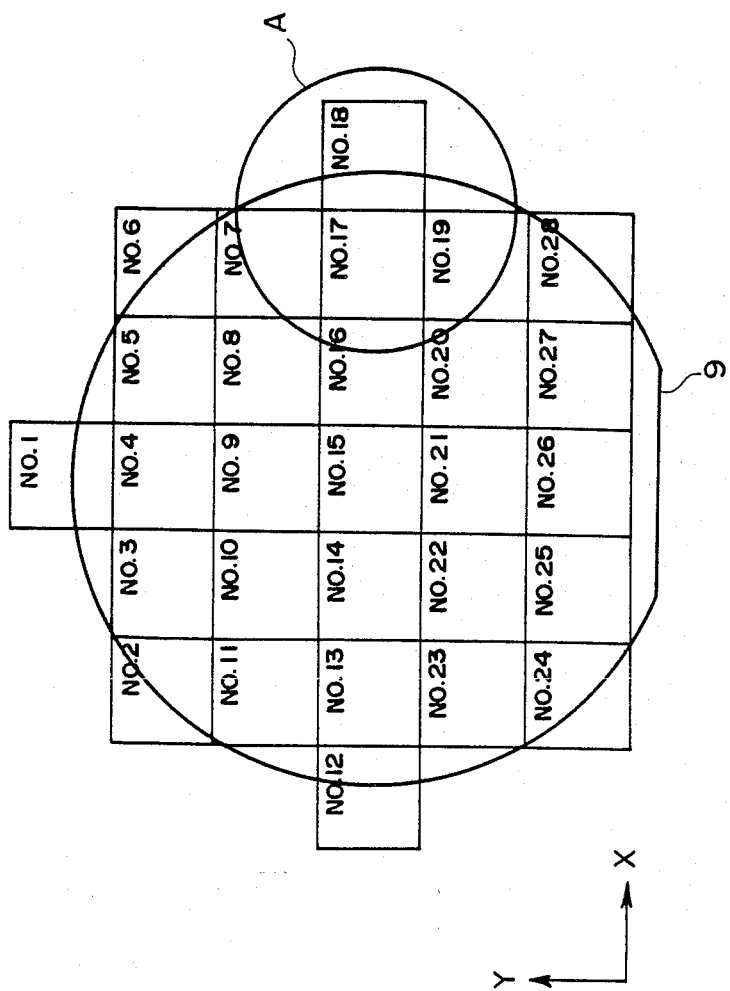
FIG. 2 is a schematic view showing an example of a shot layout defined on a wafer.
Figure 3:
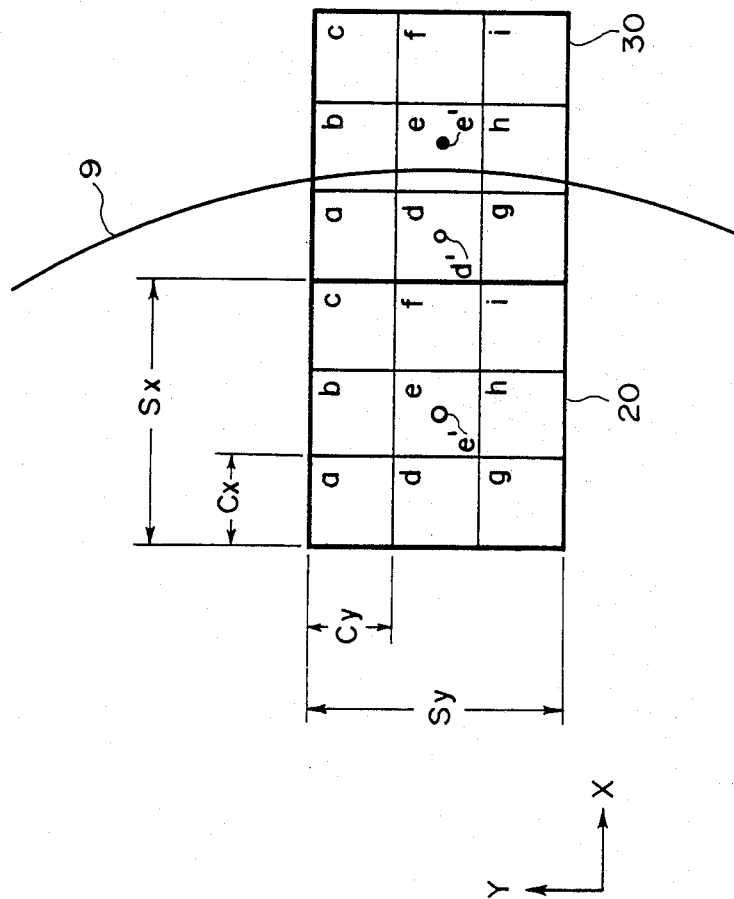
FIG. 3 is an enlarged schematic view showing a portion of the wafer of the FIG. 2 example.

Referring now to FIG. 2, there is shown an example of a shot layout defined for a wafer 9. In FIG. 2, the shot areas of the wafer 9 are designated by numbers 1–28. These shot areas are exposed sequentially in the step-and-repeat manner, in the numbered order, such that the reticle 2 pattern is printed upon each of these shot areas. FIG. 3 is an enlarged view showing, in an enlarged scale, a portion of the wafer 9 which is included in a region denoted at A in FIG. 2. Reference numeral 20 in FIG. 3 denotes the shot area of No. 17, while reference numeral 30 denotes the shot area of No. 18. In this example, each shot area is designed to cover nine (=3×3) semiconductor chips which are denoted by reference characters a–i. Namely, a reticle 2 used in this example has formed thereon nine (=3×3) chip patterns which are projected by "one exposure" upon the portions a–i, respectively, of one shot area by means of the projection lens system 5. Reference characters Sx and Sy depict, respectively, the lengths of the sides of each shot area with respect to the X and Y directions. Reference characters Cx and Cy denote, respectively, the lengths of the sides of one chip (chip pattern) with respect to the X and Y directions, respectively, as measured on the wafer 9. Among these lengths Sx, Sy, Cx and Cy, there are the following relations:

$$Sx=3Cx \text{ and } Sy=3Cy$$

In the example shown in FIG. 3, the position detecting point by the position detecting device 4, i.e. the location on the wafer 9 surface upon which the light from the light source 3 is projected, is normally set at the center of each shot area. Namely, in this example, the position detecting point for a particular shot area in a case where the position detection is going to be carried out just after completion of the normal stepwise movement by the X-Y stage 7, for positioning the particular shot area, is the center of the particular shot area. In the specific example of FIG. 3, the center of each shot area corresponds to the center of a central chip denoted at e in FIG. 3. Thus, for the shot areas 20 and 30, the centers 20e' and 30e' of the central chips 20e and 30e are normally selected as the position detecting points. However, it should be noted that the position detection for detecting the wafer surface position is, of course, attainable only within a range in which the position detecting point is on the wafer 9 surface as schematically illustrated in FIG. 3.

In the FIG. 3 example, as described hereinbefore, the wafer surface position detecting point with respect to the seventeenth shot area 20 by use of the position detecting device 4 is on the center 20e' of the chip 20e. This position is on the surface of the wafer 9, such that it is within the position detectable range for the detection of the wafer 9 position with respect to the Z-axis direction. Accordingly, as a result of the position detection, the wafer 9 surface can be accurately placed in an optical reference plane which is optically conjugate with the reticle 2 with respect to the projection lens system 5.

With regard to the next shot area (the eighteenth shot area 30), however, the regular position detecting point by the position detecting device 4, namely the center 30e' of the chip 30e (to be exact, the region upon which the central chip pattern of the reticle 2 is to be projected), is out of the wafer 9 surface as shown in FIG. 3. Therefore, if the wafer 9 is moved stepwise by the X-Y stage 7 by a distance corresponding to the length Sx for exposure of the eighteenth shot area 30, the position detecting device 4 can not detect the surface position of the wafer 9 with respect to the shot area 30. As a result, it is not possible to place the wafer 9 at such position that is optically conjugate with the reticle 2 with respect to the projection lens system 5. In other words, it is not possible to place the wafer 9 surface accurately in the imaging plane of the projection lens system 5. Because of this, the shot area 30 will be treated as a shot of "invalid chips" irrespective of that three valid chips 30a, 30d and 30g are included in the shot area 30. This is not preferable because it leads to a decrease in the yield.

Such disadvantages can be avoided in accordance with the present embodiment. Namely, according to the present embodiment, the movement of the X-Y stage 7 is controlled in a specific manner so as to displace the wafer 9 with "correction" so that the position detecting point for the shot area 30 is set to the position which is between the shot areas 20 and 30, which is within the positions detectable range and which satisfies specific conditions which are predetermined. With such corrected movement of the wafer 9, the position detection with regard to the shot area 30 is made attainable. After completion of the position detection for the shot area 30, the X-Y stage 7 is moved so as to place the shot area 30 of the wafer 9 at the exposure station. By the subsequent exposure, corresponding chip patterns are projected upon the chip regions 30a, 30d and 30g with correct focus, whereby these chips can be treated as valid chips. The amount of corrected movement of the stage 7, for the corrected displacement of the wafer 9, can be determined in the following manner:

Case A

If, for feeding the next shot area to the exposure station, the wafer 9 should be moved stepwise in the X direction, the amount of corrected movement (i.e. the distance through which the wafer 9 should be actually displaced stepwise) for allowing the position detection can be expressed as follows:

$$Sx - m \times Cx \text{ (in the X direction)}$$

wherein Sx is the preset distance for displacing the wafer by a regular stepwise movement and m is an integral number which satisfies the following relation $$m \times Cx < Sx$$

Further, the number m is such a number which assures that the position detecting point (the location upon which the position detecting light from the light source 3 is projected by the mirror 6) is set within the position detectable range (the limit of the wafer surface) and, additionally, whose absolute value is minimum. It will be readily understood that, in the FIG. 3 embodiment, the number m is selected so as to ensure that the center of a particular chip (chip 30d in this case) which is nearest to the center of the exposure area (point 30e' in this case) and which exists on the wafer surface is used as the position detecting point (denoted at 30d').

Case B

If, for feeding the next shot area to the exposure station, the wafer 9 should be displaced stepwise in the Y direction, the corrected moving distance for the wafer 9 (the distance through which the wafer 9 should be actually displaced) can be expressed as follows:

$$Sy - m \times Cy \text{ (in the Y direction)}$$

wherein Sy is the preset distance through which the wafer is displaced by a regular stepwise movement and m is an integral number which satisfies, for the same reason as described in Case A, the following relation:

$$m \times Cy < Sy$$

Similarly, the number m is such a number whose absolute value is minimum and which assures that the position detecting point is set within the position detectable range.

Case C

If, in the above-described Case A and depending on a shot layout used, the movement of the X-Y stage 7 for placing the preceding shot area (a shot area just before the current shot area having been exposed) has been corrected (namely, in a case where the detection of the wafer surface position using the center of the field of exposure is not attainable, for two successive shot areas), then the corrected movement (actual stepwise movement) to be made can be expressed by "Sx" with respect to the X direction and "m×Cy" with respect to the Y direction. In this case, m is the number which satisfies the same conditions as has been described with reference to Case B.

Case D

If, in the above-described Case B and depending on a shot layout used, the position detection for the wafer using the center of the field of exposure (which corresponds to the shot area) is not attainable for two successive shot areas, then the corrected movement (actual stepwise movement) to be made for allowing the position detection can be expressed by "$m \times Cx$" with respect to the X direction and "Sy" with respect to the Y direction. In this case, the number m satisfies the same conditions as has been described with reference to Case A.

It will be understood that, in the FIG. 3 example, the corrected movement which is actual stepwise movement is made through a distance "$Sx - Cx$" with respect to the X direction since $m = 1$. Namely, in this example, the point at which the position detection for the shot area 30 is effected is the center $30d'$ of the chip pattern $30d$.

Figure 4:
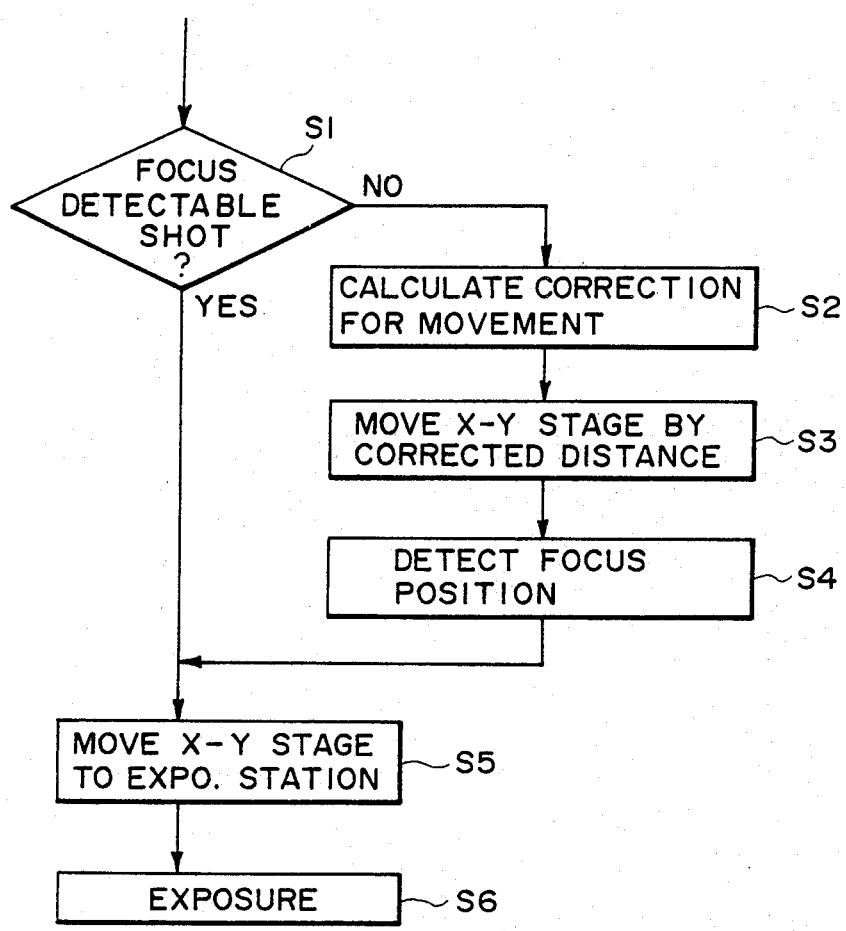
FIG. 4 is a flow chart showing the focusing operation of the projection exposure apparatus of the FIG. 1 embodiment.

Details of the operation of the FIG. 1 apparatus will now be described, taken in conjunction with the flow chart of FIG. 4.

Prior to the initiation of the stepwise movement of the X-Y stage 7 for moving the next shot area to the exposure station, defined by the projection lens system 5, for execution of the step-and-repeat exposure, the controller 11 operates (at Step S1) to discriminate, on the basis of the shot layout data concerning the wafer 9 and having been preparatorily stored, whether or not the next shot area is one whose position in the Z-axis direction can be detected by the position detecting device 4 as a result of the normal or regular stepwise movement If the result of discrimination is affirmative, the X-Y stage 7 is moved to displace the wafer 9 by an amount corresponding to the amount of regular stepwise movement (Step S5), so as to place the next shot area at the exposure station. Then, by using the position detecting device 4, the position of the Z stage is adjusted to bring the wafer 9 into an exact, optically conjugate relation with the reticle 2. Subsequently, at Step S6, the thus positioned shot area is exposed to the reticle 2 pattern by use of the light from the illumination system 1.

If, on the other hand, the result of discrimination at Step S1 is negative, the amount of corrected movement to be made is calculated at Step S2 in accordance with appropriate relations as set forth in an appropriate one of the aforementioned four cases, Cases A–D. Subsequently, at Step S3, the wafer 9 is moved by the X-Y stage 7 by an amount corresponding to the amount of corrected movement as determined at Step S2. At the position at which the corrected movement is completed, the position detecting device 4 operates to detect the position of the wafer 9 surface, and the Z stage 8 operates to adjust the position of the wafer 9 surface (Step S4). Thereafter, the controller 11 operates to move the X-Y stage 7, again, to displace the wafer 9 so that the next shot area is moved to the exposure station (Step S5) Then, at Step S6, the thus positioned shot area is exposed.

While in the present embodiment, the displacement of the wafer 9 is stopped upon completion of the corrected movement at Step S3, for the detection of the surface position, the present invention is not limited thereto. Namely, the X-Y stage 7 may be controlled so that the movement of the wafer 9 is decelerated at an end portion of the corrected movement, such that the position detection is executed to the moving wafer with the timing for the position detection being determined on the basis of the measurement by the laser interferometer 12 which is provided to measure the position of the X-Y stage 7.

In a step-and-repeat type projection exposure apparatus according to the present embodiment, as described hereinbefore, a pattern formed on an original such as a reticle can be correctly and accurately printed, by the projection exposure, even upon a peripheral portion of a workpiece such as a semiconductor wafer. Therefore, in a case of pattern printing for transferring chip patterns of a reticle onto a wafer, the number of chips, which will be treated as "invalid chips" without the present invention, can be decreased significantly. It has been confirmed that, in the example described with reference to FIGS. 2 and 3, the number of "valid chips" for one wafer can be increased by approximately 10%.

Figure 5:
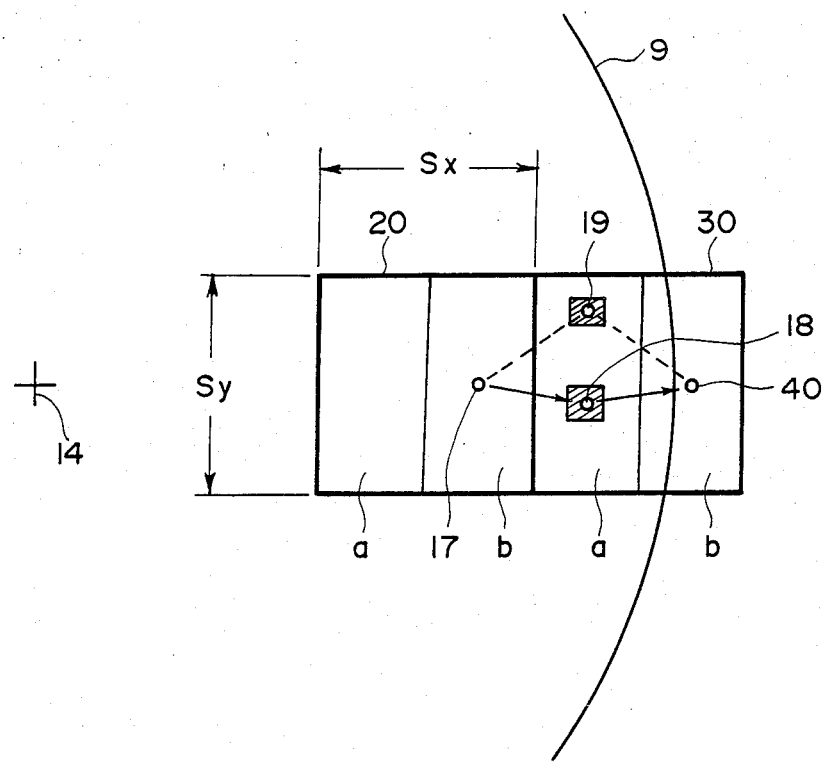
FIG. 5 is a fragmentary and schematic illustration showing another example of a shot layout defined on a wafer.

FIG. 5 is a schematic illustration showing another example of a shot layout on a wafer used with a reticle having a different type of chip patterns.

Denoted at 14 in FIG. 5 is the center of a wafer 9, and denoted at 20 and 30 are "(n)th" shot area and "(n+1)th" shot area, respectively, which are going to be exposed in sequence. In this example, chip patterns corresponding to two chips have already been formed in each shot area. Namely, chip patterns denoted at a and b have been formed in each of the shot areas 20 and 30. The chip patterns of the reticle, which is going to be used, will be superimposingly printed upon the chip patterns having been formed in each shot area.

Denoted at 17 in FIG. 5 is the point or location upon which the position detecting light is projected for the detection of the position of the wafer 9 surface in the Z-axis direction, with respect to the "(n)th" shot area 20. Denoted at 18 and 19 are "possible irradiation points" upon which the position detecting light may be projected for the position detection with regard to the "(n+1)th" shot area 30.

For the detection of the wafer surface position in the Z-axis direction with regard to the "(n)th" shot area 20 of the wafer 9, the light is projected upon the point 17 and the light reflected therefrom is detected. On the other hand, the position of the wafer 9 surface in the Z-axis direction with regard to the "(n+1)th" shot area 30 can be detected by irradiating one of the points 18 and 19 with light and by detecting the light reflected from the irradiated point. Reference characters Sx and Sy in FIG. 5 denote, respectively, the lengths of the sides of one shot area, as in the foregoing embodiment.

Each of the shot areas 20 and 30 has an exposure field (the range to be exposed) having sides of lengths Sx and Sy, respectively. The regular detecting-light irradiating points for these shot areas 20 and 30 are the points 17 and 40, respectively, which are included in the exposure fields of these shot areas. Namely, for the "(n)th" shot area 20, the wafer surface position detecting point using the position detecting device (such as at 4 in FIG. 1) is the point 17 which is included in the exposure field of this shot area. Also, the detecting point for the "(n+1)th" shot area 30 is the point 40 if the wafer is moved without "correction for movement". The distance through which the wafer is moved from a position at which the shot area 20 is exposed to a position at which the shot area 30 is exposed, corresponds to the distance between the points 17 and 40 and, therefore, is expressed by "Sx".

As seen in FIG. 5, the point 40 is out of the wafer 9 surface so that the position of the wafer 9 surface is not detectable with respect to this point. This is because, only within the limit of the wafer 9 position detecting light can be projected surface, the position detecting light can be projected upon the wafer 9. On the other hand, the "possible irradiation points" 18 and 19 are on the wafer 9 surface. Each of these points are included in a zone which has substantially the same reflection factor as that of the portion 17 of the shot area 20. Such selection of the points 18 and 19 is made so' as to avoid any error in the Z-axis position detection due to the difference in the reflection factor.

Figure 6:
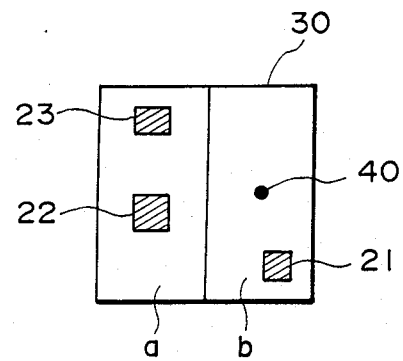
FIG. 6 is a schematic illustration showing zones in one shot area on a wafer, having the same or substantially the same reflection factor as the reflection factor of a predetermined point on the wafer upon which the focus detecting light is normally projected.

FIG. 6 is a schematic illustration showing zones each having substantially the same reflection factor as that of the detecting light irradiating point for a normal shot area, the information concerning these zones being preparatorily stored in the controller.

The thus selected zones are denoted at 21–23 in FIG. 6. With respect to each of these zones, the position of the wafer 9 surface in the Z-axis direction is detectable. Irradiating any one of these zones 21–23 with the position detecting light is effective to avoid an undesirable detection error due to the difference in the reflection factor. Therefore, it is possible to obtain an accurate positional signal as in a case where a normal detecting-light irradiating point such as at 17 (or 40) is used for the detection.

The manner of detecting the wafer surface position with regard to the shot areas 20 and 30 of this example will now be described in detail.

The detecting point 17 for the "(n)th" shot area 20 using the position detecting device 4 (FIG. 1) is on the wafer 9 surface, as described, so that the detecting light can be projected thereupon regularly. Thus, the wafer 9 can be accurately positioned in a preset optical reference plane which is optically conjugate with a reticle 2 (FIG. 1) with respect to the projection lens system 5 (FIG. 1), in accordance with the detection using the point 17.

If, on the other hand, the wafer 9 is moved by a distance "Sx" for exposure of the "(n+1)th" shot area 30, the wafer detecting point of the wafer detecting device 4 goes out of the wafer 9 surface, since the point 40 becomes the detecting light irradiating point. Therefore, the surface of the wafer 9 included in the shot area 30 cannot be accurately positioned in the imaging plane of the projection lens system 5. Accordingly, irrespective of the existence of a "valid chip" which is the left-hand chip a, the shot area 30 will be treated as a shot of invalid chips. This is undesirable because it leads to decreased yield.

In accordance with the present embodiment, as compared therewith, the movement of the X-Y stage 7 (FIG. 1) is corrected so as to enable the position detection with regard to such a shot area (e.g. the shot area 30) whose surface position is not detectable with regular stepwise movement of the stage 7. More specifically, the X-Y stage 7 is moved so that the Z-axis position detection is carried out with respect to such a portion which is between the "(n)th" shot area (in which regular detection is attainable) and the "(n+1)th" shot area (in which the regular detection is not attainable); which portion is within the light projectable range (i.e. on the wafer surface); and which portion has substantially the same reflection factor as that of the regular light-irradiating point (such as the point 17 for the shot area 20) which is the position detecting point where the X-Y stage 7 is moved regularly without correction. After the position detection, the wafer 9 is moved so as to place the "(n)th" shot area at the exposure station, thereafter, the exposure of the same is effected. By this, the chip a of the shot 20 becomes valid. Also, any detection error due to the difference in the reflection factor can be avoided.

Referring to FIG. 6, the selection of the zones 21–23 for the actual detection of the wafer surface position will now be described in detail.

Each of the zones 21–23 has substantially the same reflection factor as that of a regular irradiating point such as the point 17 (FIG. 5), as described hereinbefore. The information concerning the positions of these zones 21–23 is preparatorily stored in the controller 11 (FIG. 1) prior to the initiation of the step-and-repeat exposures of the wafer 9. After completion of the exposure of the "(n)th" shot area 20 shown in FIG. 5 and before starting the X-Y movement of the stage 7 for moving the "(n+1)th" shot area 30 to the exposure station, the controller 11 operates to discriminate whether or not the Z-axis position detection is attainable if the wafer is moved by regular stepwise movement. If the result of discrimination is negative, the controller 11 reads out the positional information concerning the zones 21–23 having been stored therein. Of these zones 21–23, only the zones 22 and 23 are included within the limit of the wafer 9 surface because they are included in the left-hand chip a (the positions of the zones 22 and 23 correspond to those of the zones 18 and 19 in FIG. 5).

Subsequently, the controller 11 operates to make calculations so as to detect which one of the moving distances to the zone 18 and to the zone 19 is smaller. This is made to minimize the moving distance of the X-Y stage 7 to thereby prevent an unpreferable decrease in the throughput. In this example, as will be readily understood from FIG. 5, the distance to the point 18 from the point 17 is smaller than the distance to the point 19 from the point 17. Thus, the point 18 (i.e. the zone 22 in FIG. 6) is selected. Namely, the X-Y stage 7 is moved so as to locate the zone 22 at the light irradiating position and the position of the wafer 9 surface in the Z-axis direction is detected by use of the position detecting device 4. Thereafter, the exposure in regard to the shot area 30 is executed.

In accordance with the present embodiment, as has been described hereinbefore, for a shot area or areas which are located at the peripheral portion of the wafer so that, with the regular stepwise movement, the position of irradiation of the light (used for detecting the wafer surface position) comes out of the detectable range, such a zone or zones of the wafer surface as having substantially the same reflection factor as that of a regular detection point which is included in the detectable range are preparatorily stored. Typically, such zone is a portion of the wafer that has a circuit pattern portion corresponding to the circuit pattern portion formed at the regular detection point, so that the zone has substantially the same surface shape as that of the regular detection point. On the basis of the thus stored information, such a point for the subsequent position detection which point is included in the detectable range and which is at a minimum distance from the preceding detection point (the point with respect to which the detection is just completed), is determined by calculation. Then, in accordance with the calculation, the wafer is moved through the corrected distance and, at the position determined by the correction, the position of the wafer 9 surface with respect to the Z-axis direction is detected. By doing so, any chip or chips which are treated as "invalid chips" without the present invention can be treated as "valid chips", with the result of improvements in the yield. Further, by selecting such a zone as having substantially the same surface shape as the regular detection point, it is possible to avoid any detection error due to the difference in the reflection factor of the wafer surface.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
    an imaging optical system usable to project, in sequence, images of a pattern including chip patterns an original upon different regions of a workpiece, said imaging optical system having an optical axis;
    detecting means operable to irradiate, with a light, a predetermined portion of a first region of the workpiece to detect the position of said first portion with respect to a direction of said optical axis of said imaging optical system;
    a workpiece carrying stage for carrying thereon the workpiece and being movable in a plane perpendicular to said optical axis, said workpiece carrying stage being movable to allow detection of the position of said first region with respect to the direction of said optical axis by said detecting means and the projection of the image of the pattern upon said first region by said imaging optical system;
    aligning means operable, in accordance with the detection by said detecting means, to bring the position of said first region with respect to the direction of said optical axis into coincidence with the image of the pattern projected by said imaging optical system; and
    correcting means operable, in accordance with the position of a second region of a workpiece with respect to the surface of the workpiece, to move said workpiece carrying stage to a position which is different from a position at which the image of the pattern of the original can be projected upon said second region, such that at said different position of said workpiece carrying stage the position of said second region with respect to the direction of said optical axis is detected by said detecting means.

2. An apparatus according to claim 1, wherein said correcting means is effective to move said workpiece carrying stage so that the light is projected by said detecting means upon such portion of said second region which portion has substantially the same surface shape as that of said predetermined portion of said first region.

3. An apparatus according to claim 1, wherein said correcting means is operable to move said workpiece carrying stage, for the detection of the position of said second region, through a minimum distance which is predetermined.

4. An apparatus according to claim 1, wherein said workpiece carrying stage is provided with a laser interferometer for measuring the position of said workpiece carrying stage.

5. An apparatus according to claim 1, wherein after the detection of the position of said second region with respect to the direction of said optical axis, said aligning means operates to move the workpiece along said optical axis so that the position of the workpiece, with respect to the direction of said optical axis, is brought into coincidence with the image of the pattern projected by said imaging optical system and wherein, simultaneously with the movement of the workpiece in the direction of the optical axis, the workpiece carrying stage is moved in the plane perpendicular to the optical axis to the position whereat the image of the pattern of the original can be projected upon said second region.

6. A projection exposure apparatus for exposing, by projection, different regions of a wafer to a pattern of a reticle having plural chip patterns, said apparatus comprising:
    a projection optical system for projecting an image of the pattern of the reticle upon the wafer;
    a movable stage for supporting the wafer and being movable to move the wafer stepwise relatively to the image of the pattern of the reticle to be projected by said projection optical system;
    position detecting means operable to detect the position, with respect to a direction of an optical axis of said projection optical system, of a region of the wafer placed at a position at which the image of the pattern of the reticle can be projected upon said region;
    discriminating means operable to discriminate whether or not the detection of the position of said region by said detecting means at a time when said region is placed at said exposure station, is attainable or not; and
    correcting means operable, in accordance with the discrimination by said discriminating means, to correct stepwise movement of said workpiece carrying stage.

7. An apparatus according to claim 6, wherein said correcting means corrects the stepwise movement of said movable stage by using a value which is obtained by multiplying, by an integral number, a value which is related to the size of the chip pattern.

8. A method for detecting a surface position of each portion of a workpiece usable upon exposing different portions of the workpiece to an original having plural chip patterns, said method comprising the steps of:
    projecting a radiation beam to a portion of the workpiece;
    detecting the surface position of the portion of the workpiece on the basis of reflection of the radiation beam by the portion; and
    changing the position of incidence of the radiation beam on the portion of the workpiece in accordance with the site of that portion on the workpiece.

9. A method according to claim 8, further comprising correcting the surface position of that portion and exposing that portion to the chip patterns of the original through a projection optical system after said detecting.

10. A method according to claim 8, the workpiece having a first portion sited in an inside region of the workpiece and a second portion sited in an outside region of the workpiece, and further comprising projecting a radiation beam on the first portion as it is positioned, with movement of the workpiece, substantially at a site for exposure of the same to the chip patterns of the original while projecting a radiation beam on the second portion as it is positioned at a different site.

11. A method according to claim 8, said detecting of the surface position of each portion being made in accordance with the sites of the portions on the workpiece.

12. A method for detecting a surface position of each portion of a workpiece usable for exposure of different portions of the workpiece to an original having plural chip patterns, said method comprising:
detecting the surface position of each portion of the workpiece through projection of a radiation beam on each portion and through detection of any of the radiation beam reflected from each portion;
carrying out the detection of the surface position of a first portion of the workpiece as the first portion is placed at an exposure station at which the first portion is to be exposed to the original; and
detecting of the surface position of a second portion of the workpiece, with respect to which the surface position is not detectable as the second portion is placed at the exposure station, is carried out as the second portion is placed away from the exposure station.

13. A method according to claim 12, further comprising correcting the surface position of the portion an exposing the portion to the chip patterns of the original through a projection optical system after said detecting.

14. A method according to claim 12, said detecting of the surface position of each portion being made in accordance with the sites of the portions on the workpiece.

15. A method for detecting a surface position of each portion of a workpiece usable for exposure of different portions of the workpiece with radiation, said method comprising:
detecting the surface position of each portion of the workpiece through projection of a radiation beam on each portion and through detection of any of the radiation beam reflected from each portion;
carrying out the detection of the surface position of a first portion of the workpiece as the first portion is placed at an exposure station at which the first portion is to be exposed to the original; and
carrying out the detection of the surface position of a second portion of the workpiece, with respect to which the surface position is not detectable as the second portion is placed at the exposure station, as the second portion is placed away from the exposure station.

16. A method according to claim 15, said detecting of the surface position of each portion being made in accordance with the sites of the portions on the workpiece.

17. A method of exposing in sequence different portions of a workpiece with radiation, comprising the steps of:
memorizing data related to the array of the portions on the workpiece;
placing the workpiece on a movable table;
projecting a radiation beam to a portion of the workpiece to detect a surface position of the same;
correcting the surface position of the portion on the basis of the detection;
exposing the portion of the workpiece with radiation after said correcting;
moving the movable table in accordance with the memorized data while the detection, correction and exposure are made to the portions of the workpiece; and
controlling the movement of the movable table such that the position of incidence of the radiation beam on each of the portions of the workpiece for detection of its surface position is changeable in accordance with the site of that portion on the workpiece.

18. A method according to claim 17, said exposing including irradiating the portion of the workpiece with radiation energy passed through an original having a plurality of chip patterns.

19. A method according to claim 18, said irradiating of the portion of the workpiece with the radiation energy including projecting of the chip patterns on that portion of the workpiece in a reduced scale by using a projection optical system.

20. A method according to claim 19, said correcting of the surface position including displacing the movable table in a direction of an optical axis of the projection optical system in accordance with said detecting to bring the surface position substantially into coincidence with a focus position of a projected image.

21. A device for detecting a surface position of each portion of a workpiece usable in an apparatus for exposing different portions of the workpiece with radiation, said device comprising:
means for projecting a radiation beam to a portion of the workpiece;
means for receiving any of the beam reflected by the portion of the workpiece;
means for detecting the surface position of the portion of the workpiece on the basis of reception of the beam by said receiving means; and
means for changing the position of incidence of the radiation beam from said projecting means upon he portion of the workpiece in accordance with the site of that portion on the workpiece.

* * * * *

UNITED STATES PATENT AND TRADEMARK OFFICE
CERTIFICATE OF CORRECTION

PATENT NO. : 4,874,954

DATED : October 17, 1989

INVENTOR(S) : Kazuo Takahashi, et al.

It is certified that error appears in the above-identified patent and that said Letters Patent is hereby corrected as shown below:

COLUMN 2

Line 58, "exposure station" should read
--exposure station.--.

COLUMN 6

Line 15, "relation" should read --relation:--.
    Line 67, "has" should read --have--.

COLUMN 7

Line 34, "movement" should read --movement.--.

COLUMN 8

Line 21, "chip patterns." should read
--chip pattern.--.

COLUMN 9

Line 11, "sc'" should read --so--.

COLUMN 11

Line 20, "an" should read --of an--.

UNITED STATES PATENT AND TRADEMARK OFFICE
CERTIFICATE OF CORRECTION

PATENT NO. : 4,874,954

DATED : October 17, 1989

INVENTOR(S) : Kazuo Takahashi, et al.

It is certified that error appears in the above-identified patent and that said Letters Patent is hereby corrected as shown below:

COLUMN 13

Line 27, "an" should read --and--.

COLUMN 14

Line 52, "he" should read --the--.

Signed and Sealed this

Fifth Day of March, 1991

Attest:

HARRY F. MANBECK, JR.

Attesting Officer

Commissioner of Patents and Trademarks